United States Patent
Liao (10) Patent No.: US 8,208,337 B2
(45) Date of Patent: Jun. 26, 2012

(54) OPERATION METHOD AND LEAKAGE CONTROLLER FOR A MEMORY AND A MEMORY APPLYING THE SAME

(75) Inventor: Chun-Yu Liao, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 301 days.

(21) Appl. No.: 12/643,071

(22) Filed: Dec. 21, 2009

(65) Prior Publication Data

US 2011/0149671 A1    Jun. 23, 2011

(51) Int. Cl.
*G11C 7/00* (2006.01)
(52) U.S. Cl. .............. 365/226; 365/185.3; 365/185.09; 365/185.22

(58) Field of Classification Search .......... 365/226, 365/185.3, 185.09, 185.22
See application file for complete search history.

(56) References Cited

U.S. PATENT DOCUMENTS

| | | | |
|---|---|---|---|
| 7,023,734 B2 * | 4/2006 | Chen | 365/185.19 |
| 7,924,610 B2 * | 4/2011 | Chen et al. | 365/185.03 |
| 7,944,747 B2 * | 5/2011 | Chae et al. | 365/185.09 |
| 2006/0002194 A1 | 1/2006 | Wooldridge | |
| 2006/0245259 A1 | 11/2006 | Fukuda et al. | |
| 2007/0247992 A1 | 10/2007 | Hwang et al. | |

* cited by examiner

*Primary Examiner* — Connie Yoha
(74) *Attorney, Agent, or Firm* — Thomas|Kayden (57) ABSTRACT

An operation method for a memory is provided. The operation method includes: starting a power on procedure on the memory; checking leakage for a bit line of the memory; and if the bit line has leakage, performing a leakage recovery on the bit line until the bit line passes the checking leakage step.

19 Claims, 6 Drawing Sheets

OPERATION METHOD AND LEAKAGE CONTROLLER FOR A MEMORY AND A MEMORY APPLYING THE SAME

TECHNICAL FIELD

The present invention generally relates to an operation method and a leakage controller for a memory and a memory applying the same, and especially relates to an operation method and a leakage controller for recovering leakage in memory cells due to over-erase and a memory applying the same.

BACKGROUND

In recent years, non-volatile memories that are data-rewritable semiconductor devices are widely used. In general, memory cells are subjected to reading operation, write operation and erase operation. During erase operation, some memory cells may be over-erased, which may need to be recovered by later soft-programming operation. But before soft-programming operation, power may be abnormal loss and therefore the over-erase memory cells are not recovered. Data reading from the memory may be incorrect due to background current leakage by the over-erased memory cells.

Therefore, how to recover background leakage from over-erased memory cells due to abnormal power loss is disclosed in the application.

BRIEF SUMMARY

Examples of the present invention are directed to an operation method for recovering over-erased memory cells during power-on procedure, by checking leakage for bit lines of the memory or by checking leakage flags.

Still examples of the present invention are directed to an operation method for recovering over-erased memory cells in response to leakage detect commands from user, by checking leakage for bit lines of the memory or by checking leakage flags.

An embodiment of the present invention provides an operation method for a memory, including steps of: starting a power on procedure on the memory; checking leakage for a bit line of the memory; and if the bit line has leakage, performing a leakage recovery on the bit line until the bit line passes the checking leakage step.

Another embodiment of the present invention provides an operation method for a memory, including steps of: receiving a leakage detect command; checking leakage for a bit line of the memory; and if the bit line has leakage, performing a leakage recovery on the bit line until the bit line passes the checking leakage step.

Still another embodiment of the present invention provides a memory, comprising: a memory array; and a leakage controller, coupled to the memory array. While a power on procedure on the memory is started, the leakage controller checks leakage for a bit line of the memory; and if the bit line has leakage, the leakage controller performs a leakage recovery on the bit line until the bit line passes the leakage checking.

Yet another embodiment of the present invention provides a memory, comprising: a memory array; and a leakage controller, coupled to the memory array. While a leakage detect command is received, the leakage controller checks leakage for a bit line of the memory; and if the bit line has leakage, the leakage controller performs a leakage recovery on the bit line until the bit line passes the leakage checking.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF EXEMPLARY EMBODIMENT OF THE INVENTION

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 1:
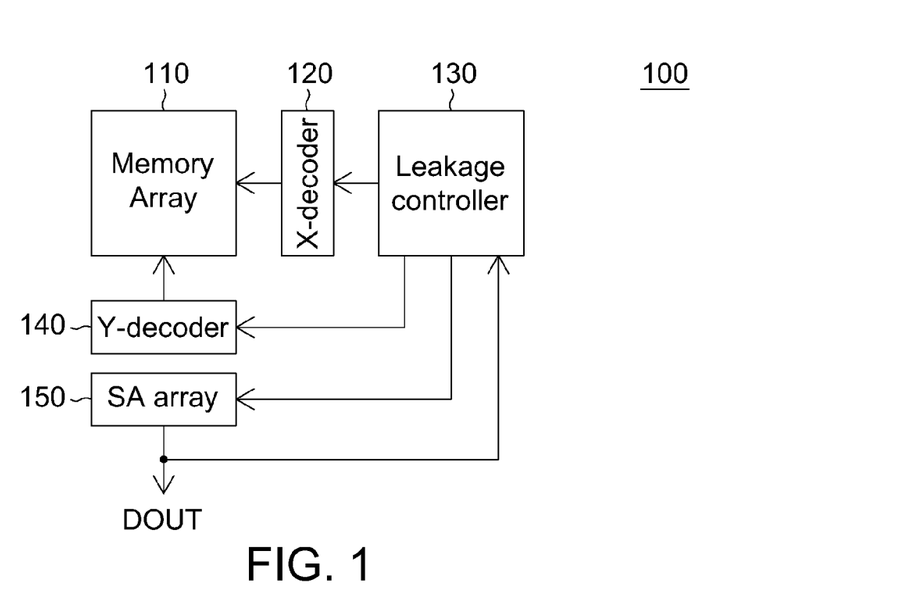
FIG. 1 shows a function block diagram of a memory according to a first embodiment of the invention.

FIG. 1 shows a function block diagram of a memory according to a first embodiment of the invention. As shown in FIG. 1, the memory 100 according to a first embodiment of the invention at least includes a memory array 110, an X-decoder 120, a leakage controller 130, a Y-decoder 140 and a sense-amplifier array 150. The memory array 110 includes a plurality of blocks. The details of the X-decoder 120, the Y-decoder 140 and the sense-amplifier array 150 are omitted here for simplicity.

Figure 2:
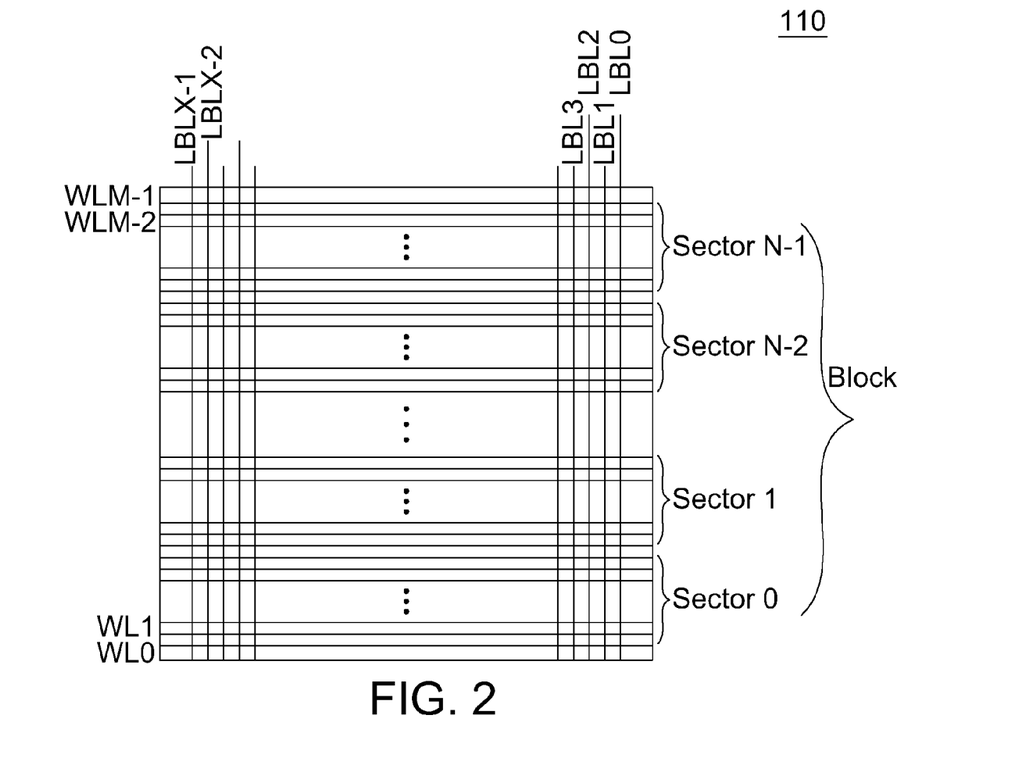
FIG. 2 shows a part of the memory array 110 in detail.

FIG. 2 shows a part of the memory array 110 in detail. As shown in FIG. 2, a block includes N sectors, Sector 0~Sector N−1 (N being a natural number). In the same block, different sectors may share the same LBL (local bit line) LBL 0~LBL X−1 (X being a natural number) and BLT (bit line transistor) to save area. Reference numbers WL 0~WL M−1 refer to word lines.

The leakage controller 130 performs leakage detection and recovery operation in the memory array 110. The details of operations and functions of the leakage controller 130 may be described later with reference to FIG. 3, FIG. 5, FIG. 7 and FIG. 8.

Figure 3:
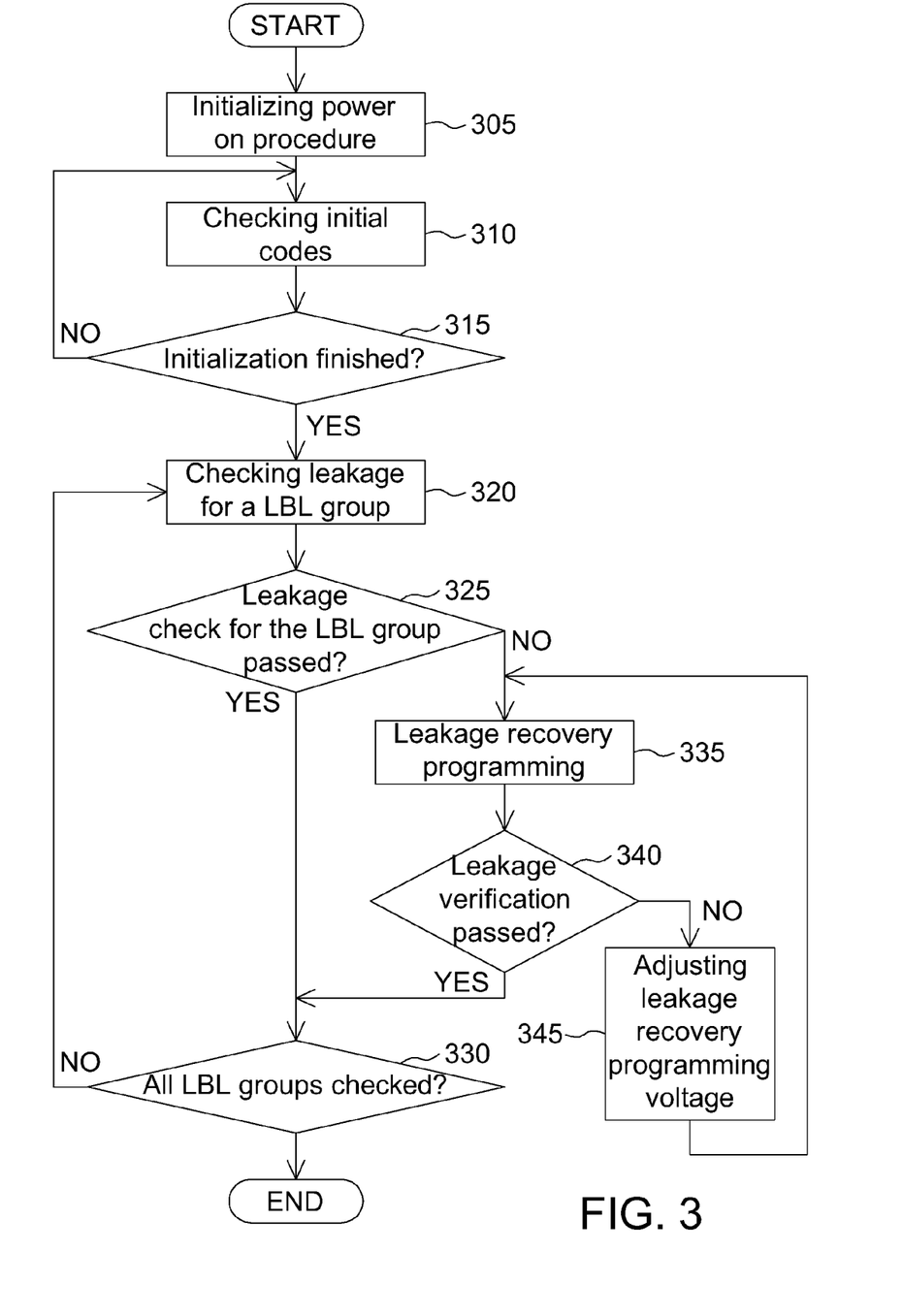
FIG. 3 shows an operation method applicable in the memory 100 according to the first embodiment.

FIG. 3 shows an operation method applicable in the memory 100 according to the first embodiment. The operation method in FIG. 3 may be used for recovering background leakage due to over-erased memory cells, by checking leakage for bit lines of the memory. The over-erased memory cells may be caused by that, in the previous erase operations, the memory cells were over-erased and the power was abnormal loss before the over-erased memory cells are processed by soft programming. The system applying the memory may be not acknowledged by the abnormal power loss event in the previous erase operation. Still further, the operation method in FIG. 3 is performed during power-on procedure.

As shown in FIG. 3, in step 305, power on procedure is initialized. In step 310, the initial codes are checked and in step 315, it is determined whether initialization is finished or not. If not, then the flow returns to step 310 to check the initial codes again. If yes, then the flow jumps to step 320.

In step 320, leakage check for a LBL group is performed. In this embodiment, the LBL group includes at least one LBL. Further, the number of LBL in one LBL group may be determined based on the number of sense amplifiers (SA) in the SA array 150. In other words, more SAs in the SA array 150, more LBLs in one LBL group. Further, the leakage check is performed on at least one word line or more word lines connected to the selected LBL group. As shown in FIG. 2, if the LBL group includes local bit lines LBL 0~LBL X−1, then the leakage check is performed on at least one or more of the word lines WL0~WL M−1 connected to the local bit lines LBL 0~LBL X−1.

In step 325, it is determined whether the leakage check for the LBL group is passed or not. In other words, in step 325, it is determined that whether the selected word line(s) connected to the LBL group has background leakage or not. If yes, then the flow jumps to step 330; and if not, then the flow jumps to step 335. In details, in the step 325, the leakage controller 130 controls the X-decoder 120 and the Y-decoder to address the selected word line(s) and the SA array 150 reads output data DOUT from the selected word line(s). The output data DOUT from the SA array 150 is sent to the leakage controller 130, so that based on the output data DOUT, the leakage controller 130 determines that whether the leakage check for the LBL group is passed or not (in other words, the leakage controller 130 determines that whether the selected word line(s) connected to the LBL group has background leakage or not).

Figure 4:
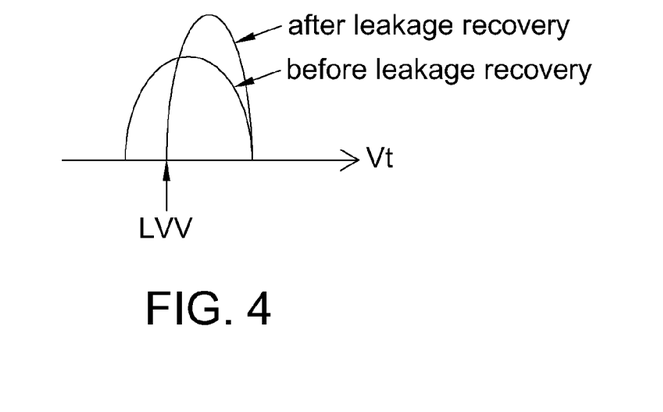
FIG. 4 shows two Vt (threshold voltage) distribution curves, before and after leakage recovery programming, respectively.

In step 335, a leakage recovery programming is performed. One example of the leakage recovery programming is shown in FIG. 4. FIG. 4 shows two Vt (threshold voltage) distribution curves, one being Vt distribution before leakage recovery programming and the other being Vt distribution after leakage recovery programming. In details, for example, the leakage recovery programming is performed by the leakage controller 130. Further, the leakage recovery programming in this embodiment may be the same or similar to the soft programming in the erase operation; and accordingly the details thereof are omitted here.

After step 335, in step 340, it is checked that whether the leakage verification on the selected LBL group is passed or not. If no, then the flow jumps to step 345; and if yes, then the flow jumps to step 330. In leakage verification, for example, a leakage verification voltage is applied, as a word line voltage, to the memory cells connected to the selected word line (which are corresponding to the selected LBL group). The leakage verification voltage (LW) is shown in FIG. 4 for example. It is determined that whether output currents from the memory cells connected to the selected word line are more than a predetermined current value or not. If any one of the output currents from the selected memory cells is more than a predetermined current value, then it is determined that the LBL group does not pass the leakage verification in step 340. Also, the leakage verification is performed by the leakage controller 130.

In step 330, it is determined that whether all LBL group in the memory is checked or not. If not, it means there is/are still other LBL group(s) which is not subjected to the leakage check yet, and the flow returns to step 320 for performing leakage check on the next LBL group. If yes, it means that all LBL groups in the memory array 110 have already been passed leakage check and that the over-erased memory cells, if any, in the memory may be recovered and the background leakage in the memory may be eliminated. So, the operation method in FIG. 3 is end and the memory may enter into a read state.

In step 345, the leakage recovery programming voltage is adjusted. For example, leakage recovery programming voltage is increased by step. Also, the adjustment of the leakage recovery programming voltage is performed by the leakage controller 130.

In brief, in the first embodiment, the leakage in the memory cells is recovered during power-on procedure, as shown in the flow chart in FIG. 3.

Second Embodiment

A memory according to a second embodiment of the invention has similar or the same functional block as the memory 100 shown in FIG. 1; and accordingly the function block of the memory according to the second embodiment of the invention is omitted.

Figure 5:
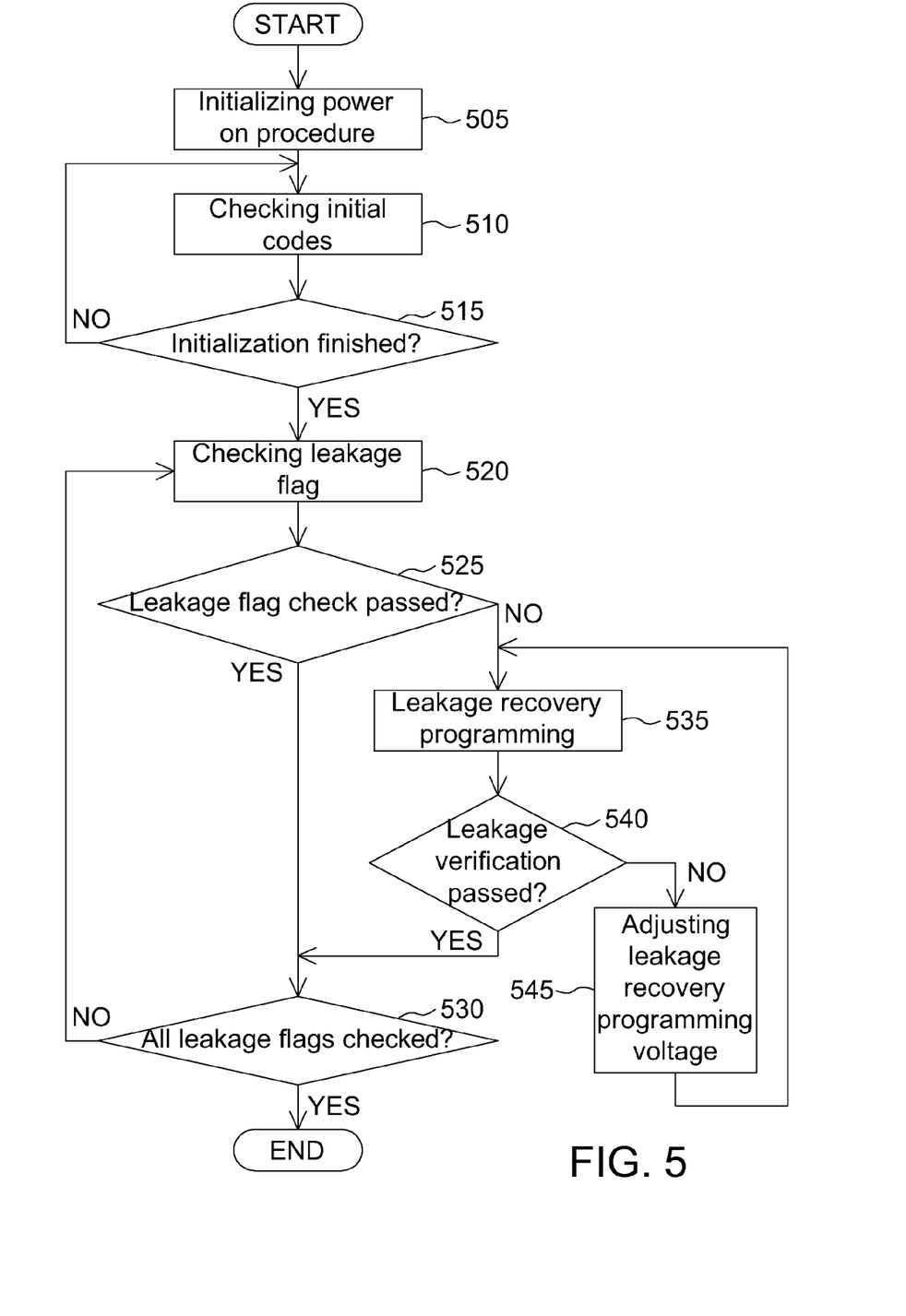
FIG. 5 shows an operation method according to a second embodiment, which is applicable in the memory.

FIG. 5 shows an operation method according to the second embodiment, which is applicable in the memory. The operation method in FIG. 5 may be used for recovering background leakage due to over-erased memory cells, by checking leakage flags of the memory. Also, the operation method in FIG. 5 is performed during power-on procedure.

As shown in FIG. 5, in step 505, power on procedure is initialized. In step 510, the initial codes are checked and in step 515, it is determined whether initialization is finished or not. If not, then the flow returns to step 510 to check the initial codes again. If yes, then the flow jumps to step 520.

Figure 6:
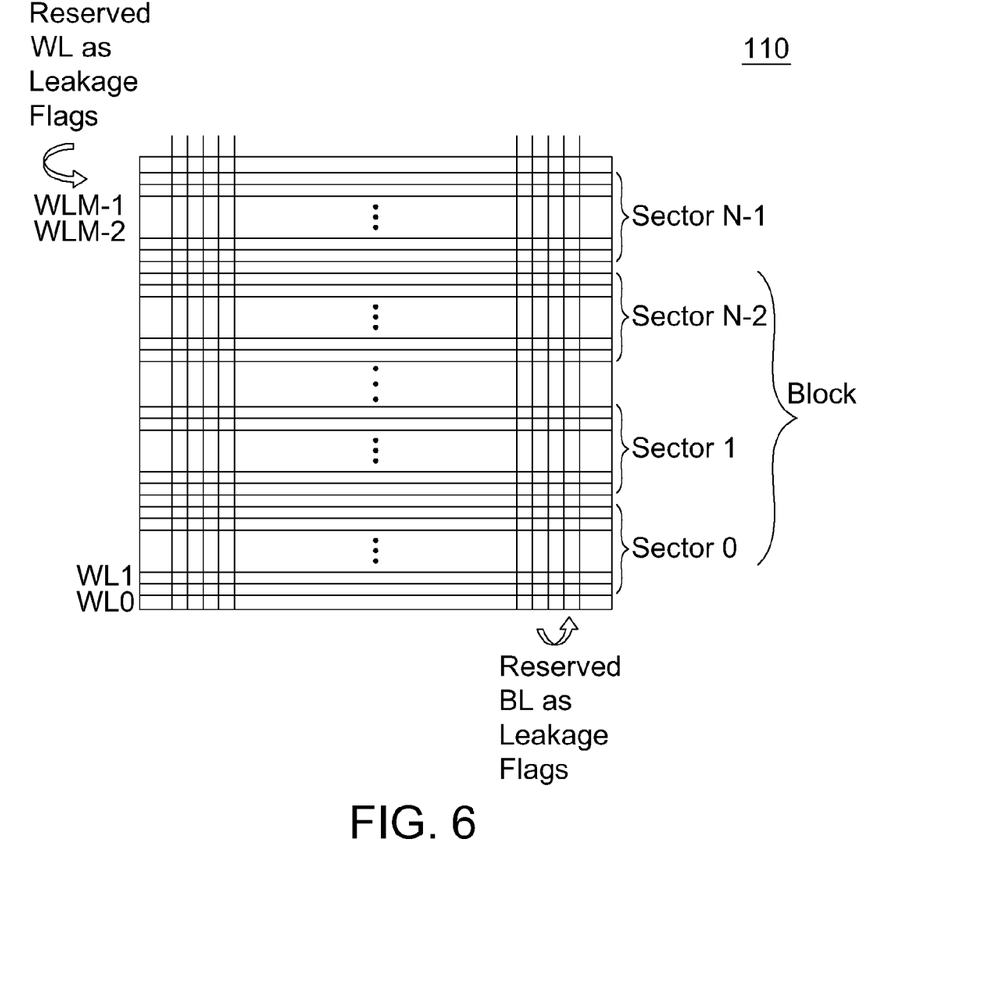
FIG. 6 shows the leakage flag of the memory according to the second embodiment.

In step 520, leakage flag of the memory is checked. In this embodiment, the leakage flags are stored in memory cells of one or more reserved word lines, or in memory cells of one or more reserved bit lines. FIG. 6 shows the leakage flag of the memory according to this embodiment. As shown in FIG. 6, memory cells of the reserved word line(s) and/or the reserved bit lines(s) may store leakage flags. In another possible implementation, all leakage flags can be collected on a same sector area.

In step 525, it is determined whether the leakage flag is passed the check or not. In other words, in step 525, it is determined that whether the reserved word line(s) or reserved bit line(s) have background leakage or not. If yes, then the flow jumps to step 530; and if not, then the flow jumps to step 535. In details, in the step 525, in checking the leakage flag, it is checked that whether the leakage flag is normal or not. In this embodiment, the leakage flag may be in a default state (for example, logic 0) before erase operation and the leakage flag is erased simultaneously with the erase of the memory cells in the same memory array. During the erase operation (i.e. before the erase operation is normally completed), the leakage flag will be erased to an abnormal erased state (for example, logic "1"). After the erase operation is normally completed, the leakage flag will be programmed back to the default state (for example, logic 0). However, if the leakage flag is over-erased and the power is abnormal loss, then the leakage flag is at the abnormal state (logic "1"). So, by checking whether the leakage flag is at normal state or at abnormal state, it is known that whether there are any over-erased memory cells in the same memory sector.

In step 535, a leakage recovery programming is performed. Further, the leakage recovery programming in this embodiment may be the same or similar to the soft programming in the common erase operation; and accordingly the details thereof are omitted here.

After step 535, in step 540, it is checked that whether the leakage verification on the sectors or on the block related to the leakage flag under check is passed or not. If no, then the flow jumps to step 345; and if yes, then the flow jumps to step 330. The leakage verification in step 540 is the same or similar to the step 340 and therefore the details are omitted.

In step 530, it is determined that whether all leakage flags in the memory are checked or not. If not, it means there is/are still other leakage flag(s) which is/are not subjected to the leakage check yet, and the flow returns to step 520 for performing leakage flag check on the next leakage flag. If yes, it means that all leakage flags in the memory array have already been passed leakage check and that the over-erased memory cells, if any, in the memory may be recovered and the background leakage in the memory may be eliminated. So, the operation method in FIG. 5 is end and the memory may enter into a read state.

In step 545, the leakage recovery programming voltage is adjusted, which is the same or similar to the step 345. The details thereof are omitted.

In brief, in this embodiment, the leakage in the memory cells is recovered during power-on procedure, by checking the leakage flags as shown in the flow chart in FIG. 5.

In other possible embodiments of the invention, the first and second embodiments would be combined. For example, but not limited to, the step 320 may be performed by step 520.

Third Embodiment

A memory according to a third embodiment of the invention has similar or the same functional block as the memory 100 shown in FIG. 1; and accordingly the function block of the memory according to the third embodiment of the invention are omitted.

Figure 7:
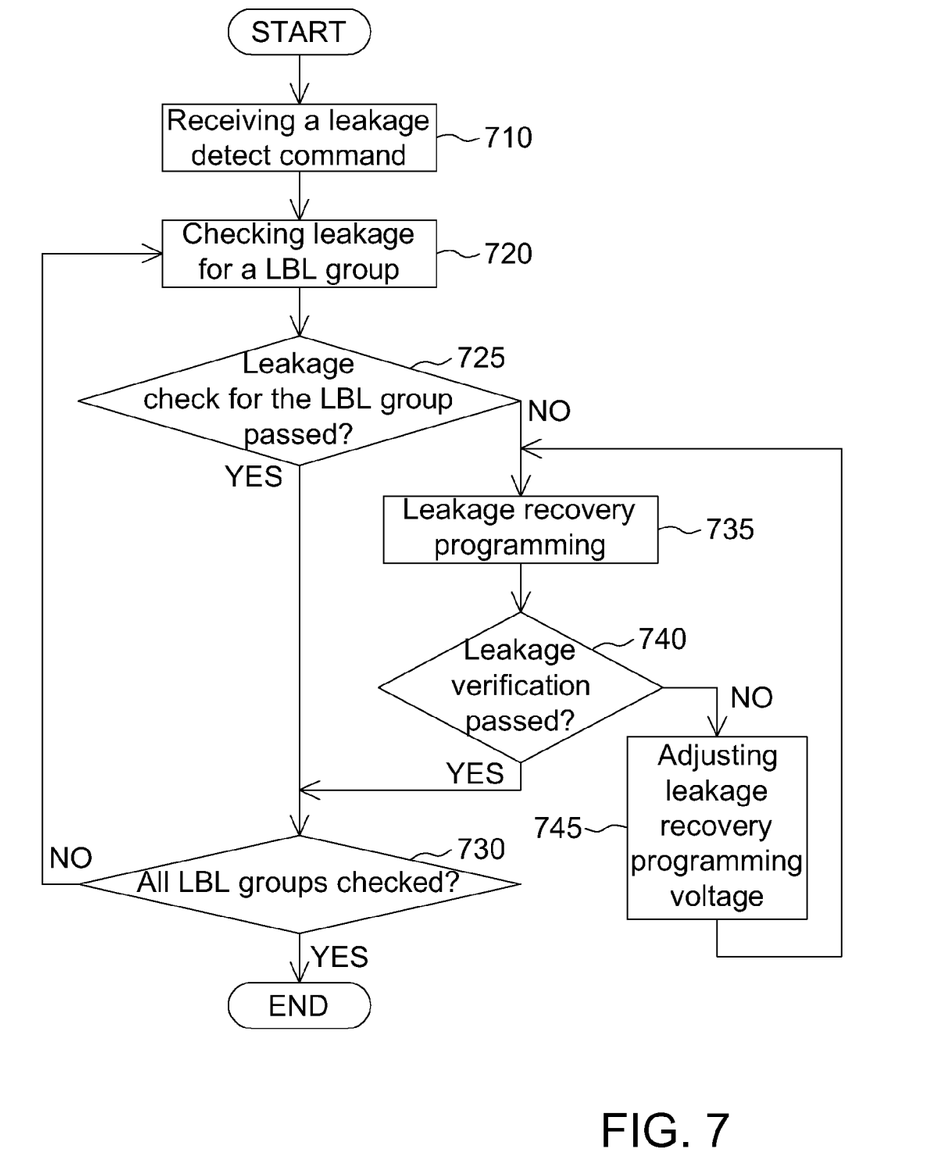
FIG. 7 shows an operation method according to a third embodiment, which is applicable in the memory.

FIG. 7 shows an operation method according to the third embodiment, which is applicable in the memory. The operation method in FIG. 7 may be used for recovering background leakage due to over-erased memory cells. The operation method in the third embodiment is triggered by a leakage detect command. The leakage detect command may come from user. Further, the leakage detect command may be received by the leakage controller. Therefore, the operation in the flow chart in FIG. 7 may be triggered at any time when the leakage detect command is received.

As shown in FIG. 7, in step 710, a leakage detect command is received. In step 720, leakage check for a LBL group is performed. Step 720 may be the same or similar with the step 320; and accordingly the details are omitted.

In step 725, it is determined whether the leakage check for the LBL group is passed or not. Step 725 may be the same or similar with the step 325; and accordingly the details are omitted. If yes in step 725, then the flow jumps to step 730; and if not in step 725, then the flow jumps to step 735.

In step 735, a leakage recovery programming is performed. Step 735 may be the same or similar with the step 335; and accordingly the details are omitted.

After step 735, in step 740, it is checked that whether the leakage verification on the selected LBL group is passed or not. If no in step 740, then the flow jumps to step 745; and if yes in step 740, then the flow jumps to step 730. Step 740 may be the same or similar with the step 340; and accordingly the details are omitted.

In step 730, it is determined that whether all LBL group in the memory is checked or not. If not in step 730, the flow returns to step 720 for performing leakage check on the next LBL group. If yes in step 730, it means that all LBL groups in the memory array have already been passed leakage check and that the over-erased memory cells, if any, in the memory may be recovered and the background leakage in the memory may be eliminated. So, the operation method in FIG. 7 is end and the memory may enter into a read state.

In step 745, the leakage recovery programming voltage is adjusted. Step 745 may be the same or similar with the step 345; and accordingly the details are omitted.

In brief, in this embodiment, the leakage in the memory cells is recovered once triggered by a leakage detect command, as shown in the flow chart in FIG. 7.

Fourth Embodiment

A memory according to a fourth embodiment of the invention has similar or the same functional block as the memory 100 shown in FIG. 1; and accordingly the function block of the memory according to the fourth embodiment of the invention are omitted.

Figure 8:
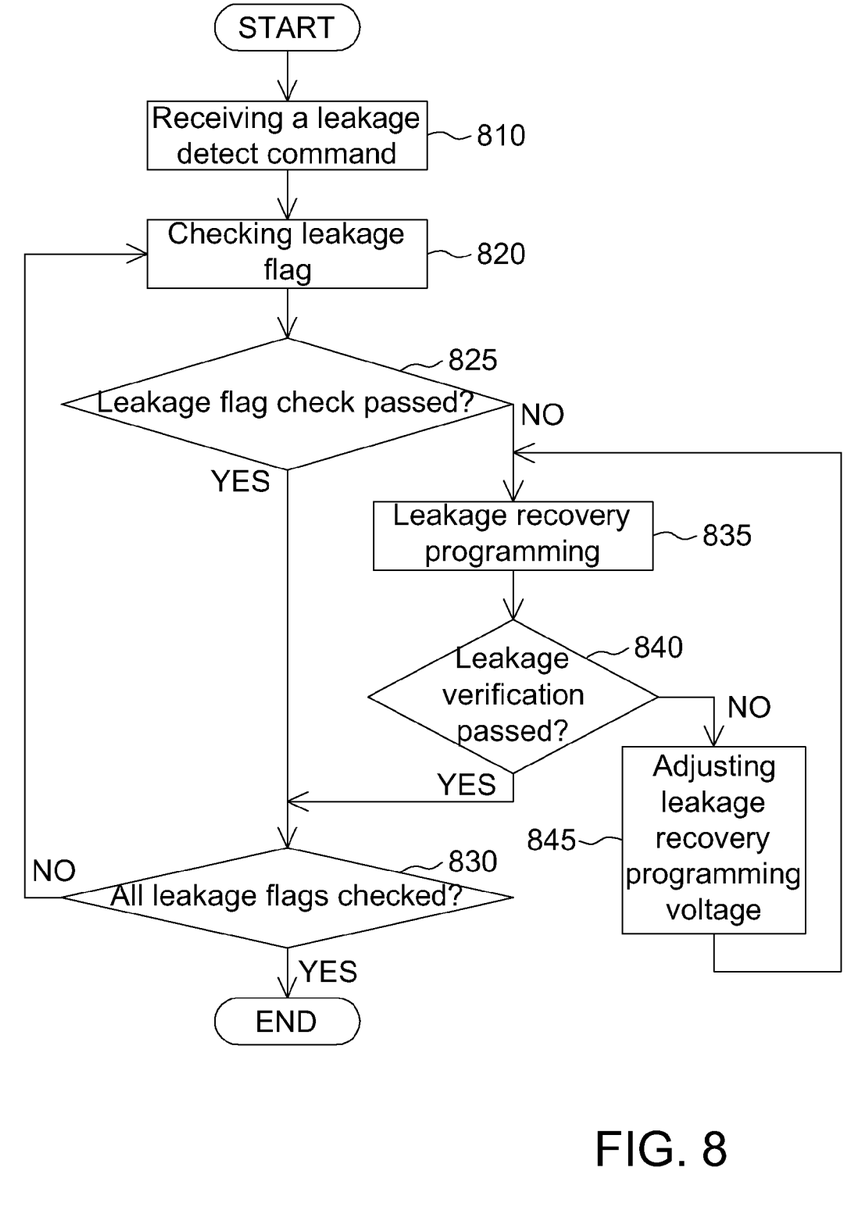
FIG. 8 shows an operation method according to a fourth embodiment, which is applicable in the memory.

FIG. 8 shows an operation method according to the fourth embodiment, which is applicable in the memory. The operation method in FIG. 8 may be used for recovering background leakage due to over-erased memory cells. The method in this embodiment is also triggered by a leakage detect command. The leakage detect command may come from user. Further, the leakage detect command may be received by the leakage controller. Therefore, the operation in the flow chart in FIG. 8 may be triggered at any time when the leakage detect command is received.

As shown in FIG. 5, in step 810, a leakage detect command is received. In step 820, leakage flag of the memory is checked. Step 820 may be the same or similar with the step 520; and accordingly the details are omitted.

In step 825, it is determined whether the leakage flag is passed the check or not. Step 825 may be the same or similar with the step 525; and accordingly the details are omitted. If yes, then the flow jumps to step 830; and if not, then the flow jumps to step 835.

In step 835, a leakage recovery programming is performed. Further, the leakage recovery programming in this embodiment may be the same or similar to the soft programming in the common erase operation; and accordingly the details thereof are omitted here.

After step 835, in step 840, it is checked that whether the leakage verification on the sectors or on the block related to the leakage flag under check is passed or not. If no, then the flow jumps to step 845; and if yes, then the flow jumps to step 830. The leakage verification in step 840 is the same or similar to the step 540 and therefore the details are omitted.

In step 830, it is determined that whether all leakage flags in the memory are checked or not. If not, it means there is/are still other leakage flag(s) which is/are not subjected to the leakage check yet, and the flow returns to step 820 for performing leakage flag check on the next leakage flag. If yes, it means that all leakage flags in the memory array have already been passed leakage check and that the over-erased memory cells, if any, in the memory may be recovered and the background leakage in the memory may be eliminated. So, the operation method in FIG. 8 is end and the memory may enter into a read state.

In step 845, the leakage recovery programming voltage is adjusted, which is the same or similar to the step 545. The details thereof are omitted.

In brief, in this embodiment, the leakage in the memory cells is recovered once triggered by the leakage detect command, by checking the leakage flags as shown in the flow chart in FIG. 8.

In other further possible embodiments of the invention, the third and fourth embodiments would be combined. For example, but not limited to, the step 720 may be performed by step 820.

Therefore, the operation method and the memory applying the same disclosed in the above embodiments have many advantages exemplified below.

Firstly, in the above embodiments, background leakage caused by over-erase memory cells after abnormal power loss is recovered; and accordingly readout data is not negatively affected by background leakage.

Secondly, in the above embodiments, in the same block, different sectors may share the same local bit lines and the same bit line transistors; and accordingly the area of the memory applying the above embodiments is reduced.

Thirdly, reliability is increased, because background leakage due to abnormal power-loss is recovered.

Fourthly, leakage check time may be reduced in the embodiments applying leakage flags, because reading leakage flags is fast.

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:

1. An operation method for a memory, comprising steps of:
    starting a power on procedure on the memory;
    checking leakage for a bit line of the memory by checking a leakage flag of the memory; and
    if the bit line has leakage, performing a leakage recovery on the bit line until the bit line passes the checking leakage step.

2. The method according to claim 1, wherein the step of performing the leakage recovery on the bit line further includes steps of:
    checking whether leakage verification on the bit line is passed or not; and
    adjusting a leakage recovery programming voltage applied to the bit line if the leakage verification on the bit line is not passed.

3. The method according to claim 2, wherein the step of checking whether the leakage verification on the bit line is passed or not includes steps of:
    applying a leakage verification voltage, as a word line voltage, to a plurality of memory cells connected to a word line;
    determining whether output currents from the memory cells connected to the word line are more than a predetermined current value or not; and
    if any one of the output currents from the memory cells is more than the predetermined current value, determining that the bit line does not pass the leakage verification.

4. The method according to claim 1, wherein the step of checking the leakage flag of the memory includes steps of:
    reserving a memory cell of a default word line or a default bit line for storing the leakage flag; and
    determining whether the leakage flag is normal or not.

5. The method according to claim 1, wherein the step of performing the leakage recovery on the bit line further comprising steps of:
    checking whether leakage verification on the bit line is passed or not; and
    adjusting a leakage recovery programming voltage applied to the bit line if the leakage verification on the bit line is not passed.

6. The method according to claim 5, wherein the step of checking whether the leakage verification on the bit line is passed or not includes steps of:
    applying a leakage verification voltage, as a word line voltage, to a plurality of memory cells connected to the word line;
    determining whether output currents from the memory cells connected to the word line are more than a predetermined current value or not; and
    if any one of the output currents from the memory cells is more than the predetermined current value, determining that the bit line does not pass the leakage verification.

7. An operation method for a memory, comprising steps of:
    receiving a leakage detect command;
    checking leakage for a bit line of the memory; and
    if the bit line has leakage, performing a leakage recovery on the bit line until the bit line passes the checking leakage step.

8. The method according to claim 7, wherein the step of performing the leakage recovery on the bit line includes steps of:
    checking whether leakage verification on the bit line is passed or not; and
    adjusting a leakage recovery programming voltage applied to the bit line if the leakage verification on the bit line is not passed.

9. The method according to claim 8, wherein the step of checking whether the leakage verification on the bit line is passed or not includes steps of:
    applying a leakage verification voltage, as a word line voltage, to a plurality of memory cells connected to a word line;
    determining whether output currents from the memory cells connected to the word line are more than a predetermined current value or not; and
    if any one of the output currents from the memory cells is more than the predetermined current value, determining that the bit line does not pass the leakage verification.

10. The method according to claim 7, wherein the checking leakage step is performed by checking a leakage flag of the memory.

11. The method according to claim 10, wherein the step of checking the leakage flag of the memory includes steps of:
    reserving a memory cell of a default word line or a default bit line for storing the leakage flag; and
    determining whether the leakage flag is normal or not.

12. The method according to claim 10, wherein the step of performing the leakage recovery step includes steps of:
    checking whether leakage verification on the bit line is passed or not; and
    adjusting a leakage recovery programming voltage applied to the bit line if the leakage verification on the bit line is not passed.

13. The method according to claim 12, wherein the step of checking whether the leakage verification on the bit line is passed or not includes steps of:
    applying a leakage verification voltage, as a word line voltage, to a plurality of memory cells connected to a word line;

determining whether output currents from the memory cells connected to the word line are more than a predetermined current value or not; and if any one of the output currents from the memory cells is more than the predetermined current value, determining that the bit line does not pass the leakage verification.

14. A memory, comprising:

a memory array; and a leakage controller, coupled to the memory array;

wherein while a power on procedure on the memory is started, the leakage controller checks leakage for a bit line of the memory by checking a leakage flag of the memory; and if the bit line has leakage, the leakage controller performs a leakage recovery on the bit line until the bit line passes the leakage checking.

15. The memory according to claim 14, wherein in performing the leakage recovery on the bit line, the leakage controller checks whether leakage verification on the bit line is passed or not; and the leakage controller adjusts a leakage recovery programming voltage applied to the bit line if the leakage verification on the bit line is not passed.

16. The memory according to claim 14, wherein based on the leakage flag, the leakage controller performs the leakage recovery on the bit line of the memory until the leakage flag passes a leakage flag checking.

17. A memory, comprising:

a memory array; and a leakage controller, coupled to the memory array;

wherein while a leakage detect command is received, the leakage controller checks leakage for a bit line of the memory; and if the bit line has leakage, the leakage controller performs a leakage recovery on the bit line until the bit line passes the leakage checking.

18. The memory according to claim 17, wherein in performing the leakage recovery on the bit line, the leakage controller checks whether leakage verification on the bit line is passed or not; and the leakage controller adjusts a leakage recovery programming voltage applied to the bit line if the leakage verification on the bit line is not passed.

19. The memory according to claim 17, wherein the leakage controller further checks leakage of the memory by checking a leakage flag of the memory; and based on the leakage flag, the leakage controller performs a leakage recovery on a bit line of the memory until the leakage flag passes the leakage flag checking.

* * * * *